(12) United States Patent  
Kwon et al.

(10) Patent No.: US 7,948,555 B2
(45) Date of Patent: May 24, 2011

(54) CAMERA MODULE AND ELECTRONIC APPARATUS HAVING THE SAME

(75) Inventors: Yong-Hwan Kwon, Suwon-si (KR); Un-Byoung Kang, Hwaseong-si (KR); Chung-Sun Lee, Gunpo-si (KR); Woon-Seong Kwon, Seoul (KR); Hyung-Sun Jang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 367 days.

(21) Appl. No.: 12/254,354

(22) Filed: Oct. 20, 2008

(65) Prior Publication Data

US 2009/0122178 A1    May 14, 2009

(30) Foreign Application Priority Data

Nov. 12, 2007   (KR) .................. 10-2007-0115032

(51) Int. Cl.
*H04N 5/225* (2006.01)
*H04N 9/077* (2006.01)
*H01L 31/0232* (2006.01)

(52) U.S. Cl. .................. 348/374; 348/280; 257/434

(58) Field of Classification Search .................. 257/680, 257/294, 432, 433, 434, 435; 348/374, 272, 348/273, 278, 279, 280, 281, 282, 283
See application file for complete search history.

(56) References Cited

U.S. PATENT DOCUMENTS

| | | | |
|---|---|---|---|
| 6,483,179 B2 | 11/2002 | Iizima et al. | |
| 6,587,147 B1* | 7/2003 | Li | 348/280 |
| 6,780,667 B2 | 8/2004 | Iizima et al. | |
| 2001/0010952 A1* | 8/2001 | Abramovich | 438/151 |
| 2002/0105591 A1* | 8/2002 | Nakamura et al. | 348/374 |
| 2003/0142226 A1* | 7/2003 | Wester | 348/273 |
| 2005/0212947 A1* | 9/2005 | Sato et al. | 348/374 |
| 2006/0061889 A1* | 3/2006 | Tan et al. | 359/820 |
| 2007/0070448 A1 | 3/2007 | Jung et al. | |
| 2007/0217786 A1* | 9/2007 | Cho et al. | 396/542 |
| 2008/0180566 A1* | 7/2008 | Singh | 348/373 |

FOREIGN PATENT DOCUMENTS

| | | |
|---|---|---|
| JP | 2001-257334 | 9/2001 |
| JP | 2006-135741 | 5/2006 |
| KR | 100692977 B1 | 3/2007 |

* cited by examiner

*Primary Examiner* — Jason Whipkey
(74) *Attorney, Agent, or Firm* — Volentine & Whitt, PLLC

(57) ABSTRACT

A camera module includes an image sensor chip, a lens structure, a transparent substrate, an adhesive portion, and a light blocking layer. The image sensor chip includes a light receiving area and a circuit area. The lens structure is positioned on the image sensor chip and configured to allow light to enter the image sensor chip. The transparent substrate is positioned between the image sensor chip and the lens structure, the transparent substrate allowing light from the lens structure to enter the light receiving area. The adhesive portion attaches the image sensor chip and the transparent substrate, and covers the circuit area. The light blocking layer is attached to the transparent substrate to block light from entering the circuit area.

17 Claims, 13 Drawing Sheets

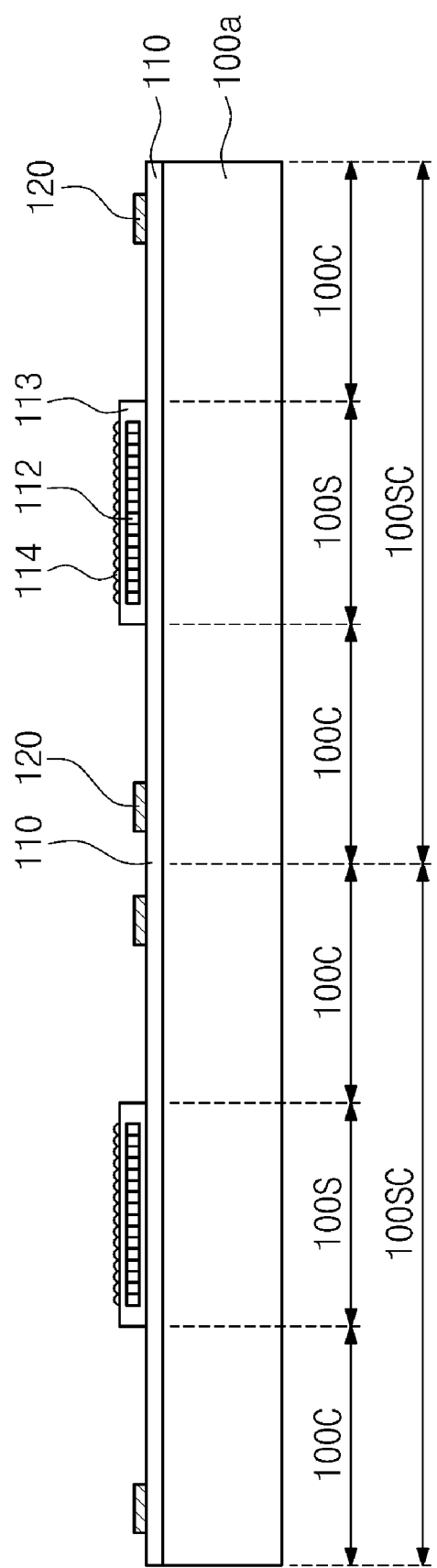

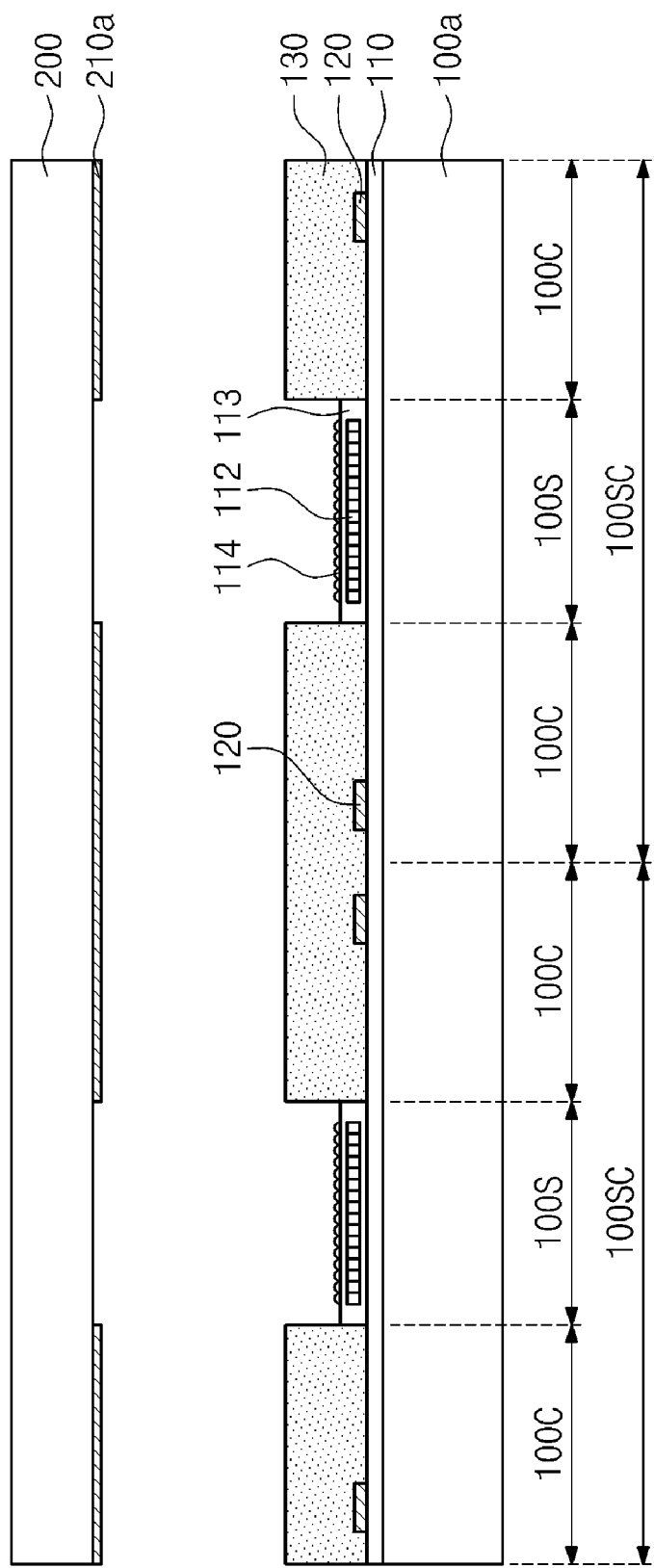

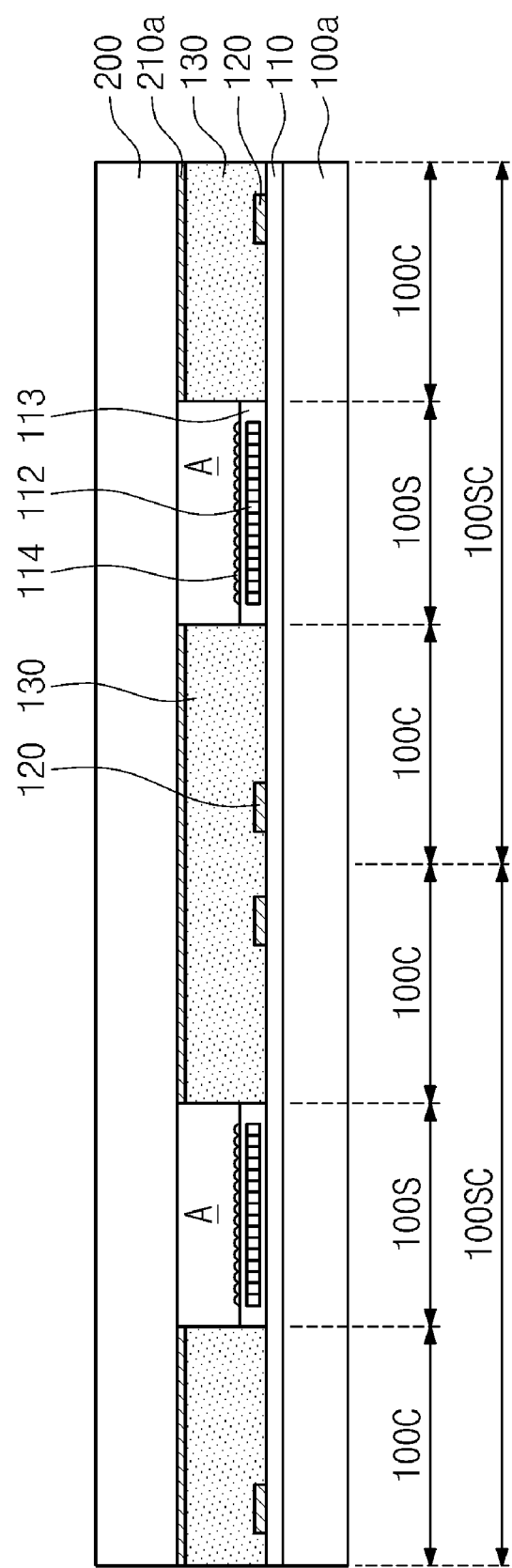

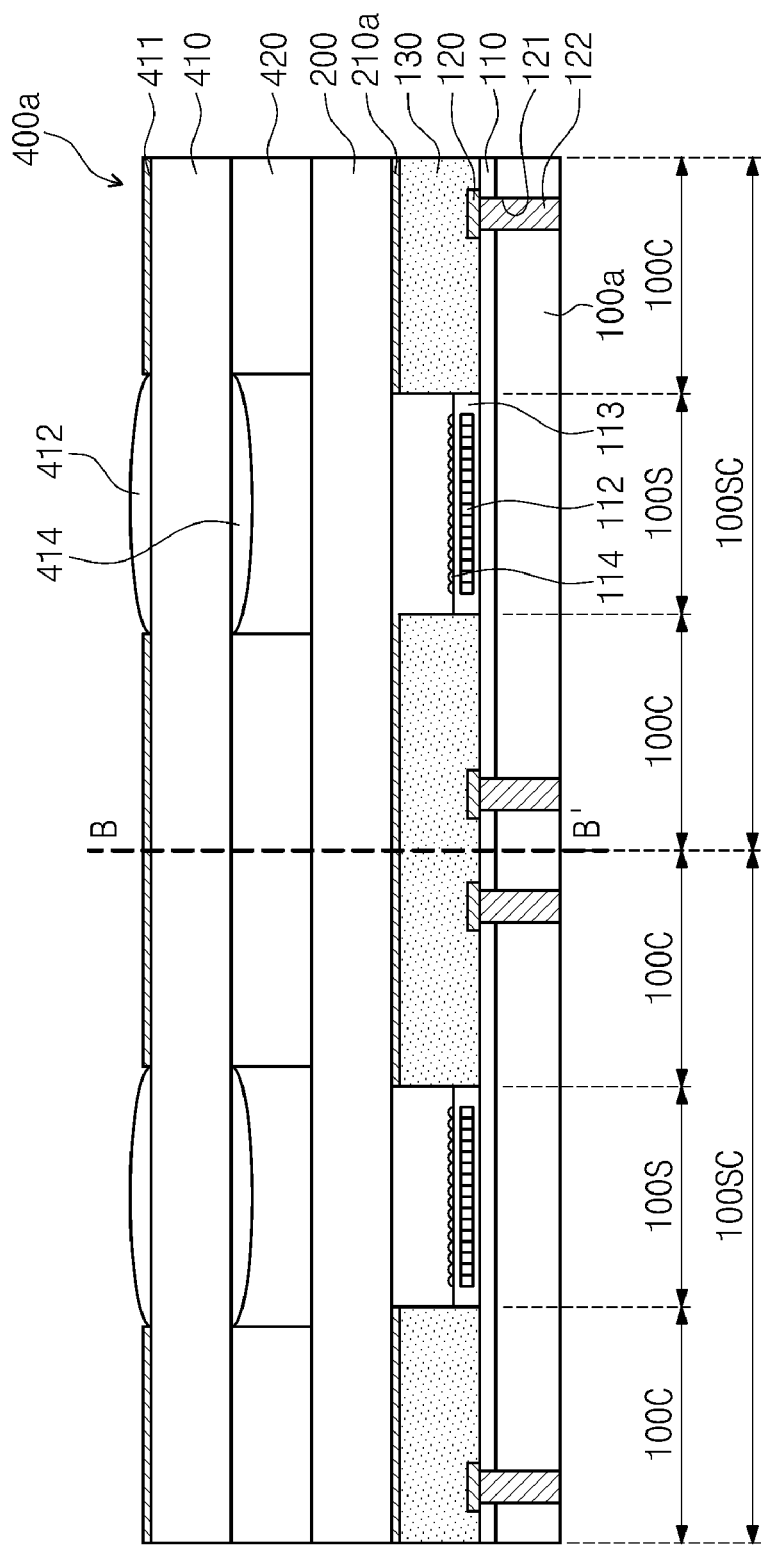

CAMERA MODULE AND ELECTRONIC APPARATUS HAVING THE SAME

PRIORITY CLAIM

A claim of priority is made to Korean Patent Application No. 10-2007-0115032, filed on Nov. 12, 2007, in the Korean Intellectual Property Office, the subject matter of which is hereby incorporated by reference

SUMMARY

The present invention relates to a camera module and an electronic apparatus having the same.

Cellular phones incorporating digital cameras are widely used. The camera module for most cellular phones includes an optical lens and an image sensor, which converts incident light from the optical lens to an electrical signal. The electrical signal converted by the image sensor is transferred to an image signal processing unit (ISP) and is output as an image signal.

More particularly, in the image sensor, the light from the optical lens passes through microlenses and red, green, and blue (RGB) filters, and is incident on a photodiode. The photodiode generates charges corresponding to the intensity of the incident light, and then transfers the charges in the form of the electrical signal to the ISP. At this point, when unnecessary light enters an image sensor chip, image quality may be adversely affected.

Embodiments of the present invention provide a camera module including an image sensor chip, a lens structure, a transparent substrate, an adhesive portion, and a light blocking layer. The image sensor chip includes a light receiving area and a circuit area. The lens structure is positioned on the image sensor chip and configured to allow light to enter the image sensor chip. The transparent substrate is positioned between the image sensor chip and the lens structure, the transparent substrate allowing the light from the lens structure to enter the light receiving area. The adhesive portion attaches the image sensor chip and the transparent substrate, and selectively covers the circuit area. The light blocking layer is attached to the transparent substrate to block light from entering the circuit area.

The light blocking layer may be between the transparent substrate and the adhesive portion. Alternatively, the light blocking layer may be between the transparent substrate and the lens structure. Further, the light blocking layer may include one of metal and a carbon-based organic material.

The image sensor chip may further include a dielectric positioned below the adhesive portion and covering the light receiving area and the circuit area of the image sensor chip. The dielectric may include one of a silicon oxide layer and a silicon nitride layer.

The adhesive portion may include one of a polyimide-based adhesive and an epoxy-based adhesive.

The image sensor chip may further include a color filter layer located within the light receiving area, and surrounded by a polymer layer that does not extend between the adhesive portion and a portion of the image sensor chip corresponding to the circuit area.

The adhesive portion may define a cavity, extending between the image sensor chip and the transparent substrate, exposing the light receiving area. The image sensor chip may further include a color filter layer located in the cavity, and surrounded by a polymer layer that does not extend between the adhesive portion and a portion of the image sensor chip corresponding to the circuit area.

The image sensor chip may further include an electrode located in the circuit area and providing an outside electrical connection.

The lens structure may include a lens substrate; a support substrate on the transparent substrate for supporting the lens substrate, the support substrate defining an opening corresponding to the light receiving area; a first lens on an upper surface of the lens substrate and a second lens on a lower surface of the lens substrate, the lower surface being opposite to the upper surface; and a light blocking layer adjacent to the first lens on the upper surface of the lens substrate to block entrance of light to areas other than the light receiving area.

The camera module may further include a housing covering sides of the lens structure, the transparent substrate, and the image sensor chip.

Other embodiments of the present invention provide a camera module including an image sensor chip, a lens structure, a transparent substrate, and an adhesive portion. The image sensor chip includes a light receiving area and a circuit area. The lens structure is located on the image sensor chip and configured to enable light to enter the image sensor chip. The transparent substrate is positioned between the image sensor chip and the lens structure, and enables the light from the lens structure to enter the light receiving area. The adhesive portion attaches the image sensor chip and the transparent substrate, and covers the circuit area. The adhesive portion includes a light blocking agent for blocking unnecessary light from entering at least the circuit area.

The adhesive portion may include one of a polyimide-based adhesive and an epoxy-based adhesive.

The light blocking agent may include one of metal and a carbon-based organic material.

According to the embodiments, a camera module blocks unnecessary light and obtains high quality images, and an electronic apparatus may include the camera module.

BRIEF DESCRIPTION OF THE DRAWINGS

The embodiments of the present invention will be described with reference to the attached drawings, wherein like reference numerals refer to like parts unless otherwise specified, and in which:

FIGS. 3A through 3G are a series of cross-sectional views of a camera module for explaining a fabrication method, according to a first embodiment of the present invention;

DETAILED DESCRIPTION OF THE EMBODIMENTS

Figure 1:
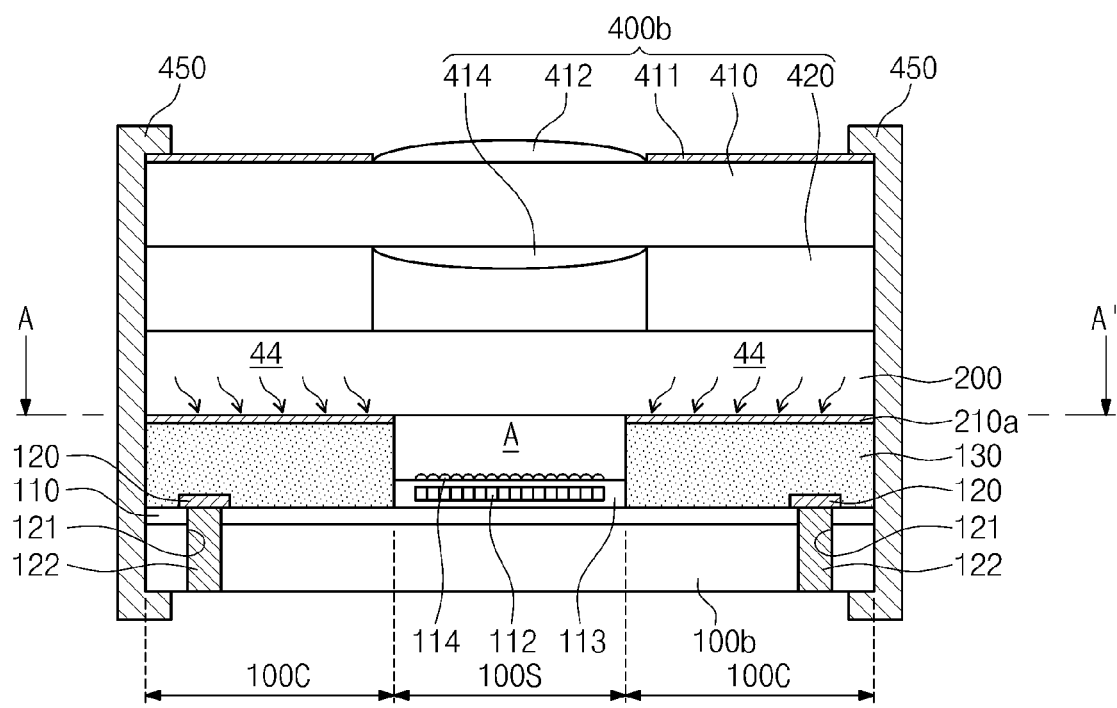
FIG. 1 is a cross-sectional view of a camera module, according to a first embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Further, in the drawings, the dimensions of layers and regions are exaggerated for clarity of illustration. It will also be understood that when a layer (or film) is referred to as being "on" another layer or substrate, it may be directly on the other layer or substrate, or intervening layers may also be present.

Figure 2:
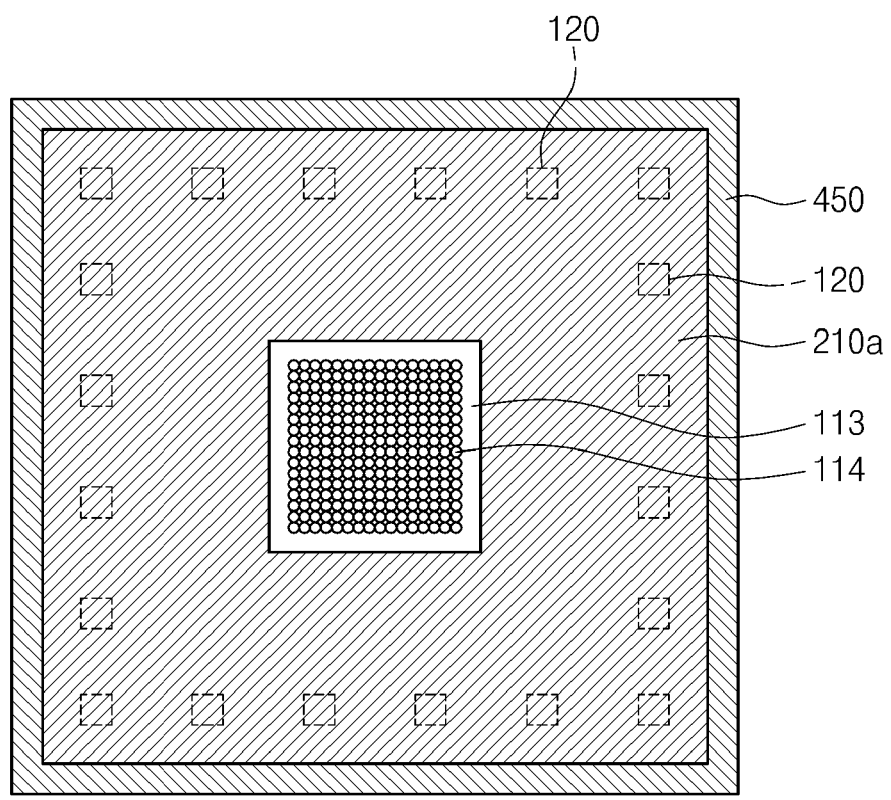
FIG. 2 is a plan view taken along line A-A' of FIG. 1, according to a first embodiment of the present invention.

FIG. 1 is a cross-sectional view of a camera module, according to an illustrative first embodiment of the present invention, and FIG. 2 is a plan view taken along the line A-A' of FIG. 1.

Referring to FIGS. 1 and 2, the camera module includes an image sensor chip 100b, a lens structure 400b on the image sensor chip 100b, a transparent substrate 200 between the image sensor chip 100b and the lens structure 400b, and an adhesive portion 130 attaching the image sensor chip 100b and the transparent substrate 200.

The image sensor chip 100b includes a light receiving area 100S and circuit areas 100C. The image sensor chip 100b also includes or is covered by a dielectric 110 on the light receiving area 100S and the circuit areas 100C. The dielectric 110 may include a silicon nitride layer or a silicon oxide layer, for example. The image sensor chip 100b includes a color filter layer 112 and microlenses 114 on a portion of the dielectric corresponding to the light receiving area 100S. The color filter layer 112 may include a dyed photoresist, for example. A polymer layer 113 surrounds the color filter layer 112. The polymer layer 113 is limited to being on the light receiving area 100S, and thus may not be located between the transparent substrate 200 and the adhesive portion 130. The microlenses 114 are provided on the polymer layer 113, and may include a polyimide-based resin or a low temperature oxide (LTO), for example.

The image sensor chip 100b has electrodes in the circuit area 100C for electrically connecting with an external circuit. The electrodes include output pads 120 and pillar type bumps 122. The output pads 120 are arranged at the edges of the image sensor chip 100b. The output pads 120 are electrically connected to image sensor arrays (not shown) formed under the microlenses 114. The pillar type bumps 122 fill through via holes 121 passing through the image sensor chip 100b under the output pads 120. The pillar type bumps 122 electrically contact the output pads 120 and are used as electrical connection paths between the image sensor chip 100b and an external circuit. For example, to electrically connect with an external circuit, redistribution patterns (not shown) electrically connected with exposed pillar type bumps 122 and solder bumps (not shown) on the redistribution patterns, may be provided. The redistribution patterns may be disposed in various shapes to connect with an external circuit.

The transparent substrate 200, which enables entrance of light to the light receiving area 100S, is provided on the image sensor chip 100b. The transparent substrate 200 may be a glass substrate, for example, having excellent light transmittance, such as a glass substrate including soda-lime glass and/or boro-silicate glass. The transparent substrate 200 may include a light blocking layer 210a for blocking unnecessary light 44 (e.g., light not entering the light receiving area 100S). That is, the light blocking layer 210a prevents the unnecessary light 44 from entering areas other than the light receiving area 100S, such as the circuit areas 100C. According to the first embodiment of the present invention, the light blocking layer 210a covers the circuit areas 100C and may be located between the transparent substrate 200 and the adhesive portion 130. The light blocking layer 210a may include metal, such as chromium (Cr) or a carbon-based organic material, for example. The light transmittance of the light blocking layer 210a may be 30% or below, for example. An infrared filter (not shown) may be provided on the lower side of the transparent substrate 200 facing the light blocking layer 210a. This is for blocking an infrared region of light incident on the image sensor.

The adhesive portion 130 attaches the transparent substrate 200 to the image sensor chip 100b and covers the circuit areas 100C. The adhesive portion 130 may include polyimide-based adhesive or an epoxy-based adhesive, for example. The adhesive portion 130 defines a cavity A between the image sensor chip 100b and the transparent substrate 200 to open the light receiving area 100S.

If the polymer layer 113 were located between the adhesive portion 130 and the dielectric 110, the adhesive characteristic between the adhesive portion 130 and the image sensor chip 100b would be deteriorated. Therefore, the polymer layer 113 according to the present embodiment is located only on a portion of the dielectric 110 corresponding to the light receiving area 100S, and the adhesive portion 130 is located on portions of the dielectric 110 corresponding to the circuit areas 100C. That is, the polymer layer 113 does not extend over the circuit areas 100C, but is limited to the light receiving area 100S. Accordingly, the adhesive characteristic between the adhesive portion 130 and the image sensor chip 100b increases. The adhesive portion 130 may contact the lateral sides of the polymer layer 113 on the light receiving area 100S.

The lens structure 400b is provided on the image sensor chip 100b. The lens structure 400b includes lens substrate 410, support substrate 420, first lens 412 on an upper surface of the lens substrate 410 and second lens 414 on a lower surface (opposite to the upper surface) of the lens substrate 410, and light blocking layer 411 located on the sides of the first lens 412 on the upper surface of the lens substrate 410. The lens substrate 410 may be a glass substrate of the same kind as that used for the transparent substrate 200, for example. The support substrate 420 is on the transparent substrate 200 to support the lens substrate 410. The support substrate 420 includes an opening above the light receiving area 100S. The first and second lenses 412 and 414 are substantially aligned with the light receiving area 100S, so that light passing through the first and second lenses 412 and 414 is directed to the light receiving area 100S. The first and second lenses 412 and 414 may include glass or polymer, for example. The light blocking layer 411 blocks light from entering areas other than the light receiving area 100S. In various embodiments, the lens structure 400b may be provided in a multi-layered structure, including multiple lens substrates 410 and multiple first and second lenses 412 and 414.

A housing 450 may cover the lateral sides of the lens structure 400b, the transparent substrate 200, and the image sensor chip 100b. The housing 450 may suppress light passing through and incident to the lateral sides.

FIGS. 3A through 3G are cross-sectional views of a camera module, for explaining a method of fabricating the camera module, according to an exemplary first embodiment of the present invention.

Referring to FIG. 3A, an image sensor chip substrate 100a, including light receiving areas 100S and the circuit areas 100C, is formed. The light receiving areas 100S and the circuit areas 100C are grouped as chip areas 100SC. The image sensor chip substrate 100a includes dielectric 110 on the chip area 100SC. The dielectric 110 may include a silicon nitride layer or a silicon oxide layer, for example. The silicon nitride layer or the silicon oxide layer has a good adhesive characteristic with respect to the adhesive portion 130 (of FIG. 3B), which is subsequently formed.

Color filter layer 112 and microlenses 114 are formed on a portion of the dielectric 110 corresponding to the light receiving area 100S. The color filter layer 112 may be formed using a dyed photoresist, for example. The color filter layer 112 may be surrounded by polymer layer 113, which is limited to the light receiving area 100S and does not extend over the circuit areas 100C. The microlenses 114 may be formed, for example, by patterning a polyimide-based resin or a low temperature oxide (OTO) and reflowing the same. Output pads 120 are formed at the edges of the chip areas 100SC. The output pads 120 are electrically connected to image sensor arrays (not shown) formed under the microlenses 114.

Referring to FIG. 3B, the adhesive portion 130, having an opening that exposes the light receiving area 100S, is formed on the image sensor chip substrate 100a. A forming process of the adhesive portion 130 may be a screen printing process, for example. The adhesive portion 130 may be formed, for example, of a polyimide-based adhesive or an epoxy-based adhesive. The adhesive portion 130 covers the circuit areas 100C. According to the present embodiment, the adhesive portion 130 is formed on portions of the dielectric 110 corresponding to the circuit areas 100C, and the polymer layer 113 is formed on portions of the dielectric 110 corresponding to the light receiving areas 100S. That is, the polymer layer 113 does not extend over the circuit areas 110C, but is limited to the light receiving areas 100S. Therefore, the adhesive portion 130 has a good adhesive characteristic with respect to the image sensor chip substrate 100a. The adhesive portion 130 may contact the lateral sides of the polymer layer 113 on the light receiving area 100S.

A transparent substrate 200 is formed on the image sensor chip substrate 100a, including the adhesive portion 130. The transparent substrate 200 may be a glass substrate having excellent light transmittance, such as soda-lime glass and/or boro-silicate glass. Light blocking layer 210a is formed on predetermined areas of a bottom surface of the transparent substrate 200. The light blocking layer 210a may include metal, such as Cr or a carbon-based organic material, for example. The light blocking layer 210a blocks unnecessary light from entering the circuit areas 100C. The light transmittance of the light blocking layer 210a may be 30% or below, for example. The transparent substrate 200 is aligned on the image sensor chip substrate 100a, such that the light blocking layer 210a covers the circuit areas 100C.

Referring to FIG. 3C, the transparent substrate 200 is attached to the image sensor chip substrate 100a. The attaching process may be a thermo compression process, for example. Accordingly, the adhesive portion 130 surrounds the light receiving portion 100S and attaches the transparent substrate 200 to the image sensor chip substrate 100a. Accordingly, cavity A is formed between the light receiving portion 100S of the image sensor chip substrate 100a and the transparent substrate 200. The cavity A may prevent production yield reduction by particles in a subsequent process. The adhesive portion 130 covers the output pads 120.

After the transparent substrate 200 is attached to the image sensor chip substrate 100a, the image sensor chip substrate 100a may be polished using a polishing process. The transparent substrate 200 may be used as a support substrate. The polishing process may include a backside grinding process or a chemical mechanical polishing (CMP) process, for example. The image sensor chip substrate 100a becomes thinner by the polishing process. Also, an infrared filter (not shown) may be formed on the lower side of the transparent substrate 200 facing the light blocking layer 210a for blocking an infrared region of light incident to the image sensor.

Figure 3D:
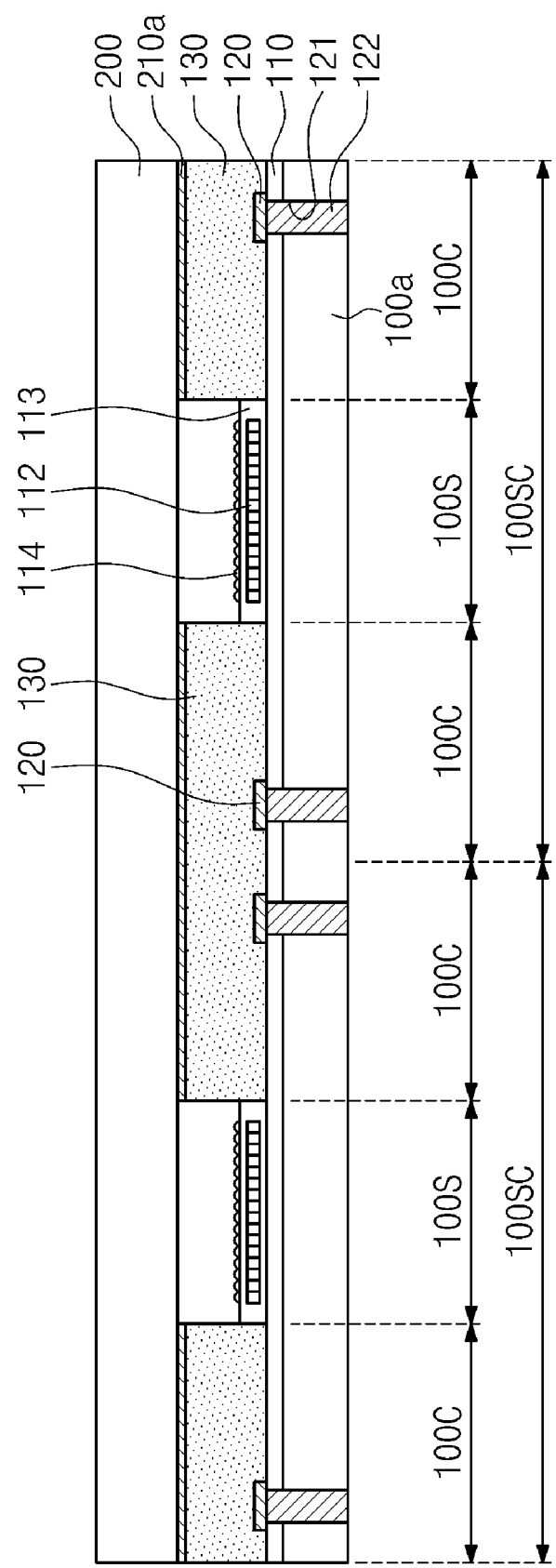

Referring to FIG. 3D, via holes 121 passing through the edges of the chip areas 100SC to expose the output pads 120 are formed by patterning the image sensor chip substrate 100a. The forming of the via holes 121 may be performed using laser drilling technology or reactive ion etching technology, for example.

Pillar type bumps 122 filling the via holes 121 are formed. The pillar type bumps 122 are used for electrical connection paths between the image sensor chip and an external circuit. The pillar type bumps 122 may be formed of at least one metal material, for example. The pillar type bumps 122 allow the output pads 120 to connect with external circuits. Redistribution patterns (not shown) for easy connection with external circuits, and solder bumps (not shown) on the redistribution patterns, may be formed on the exposed surfaces of the pillar type bumps 122.

Figure 3E:
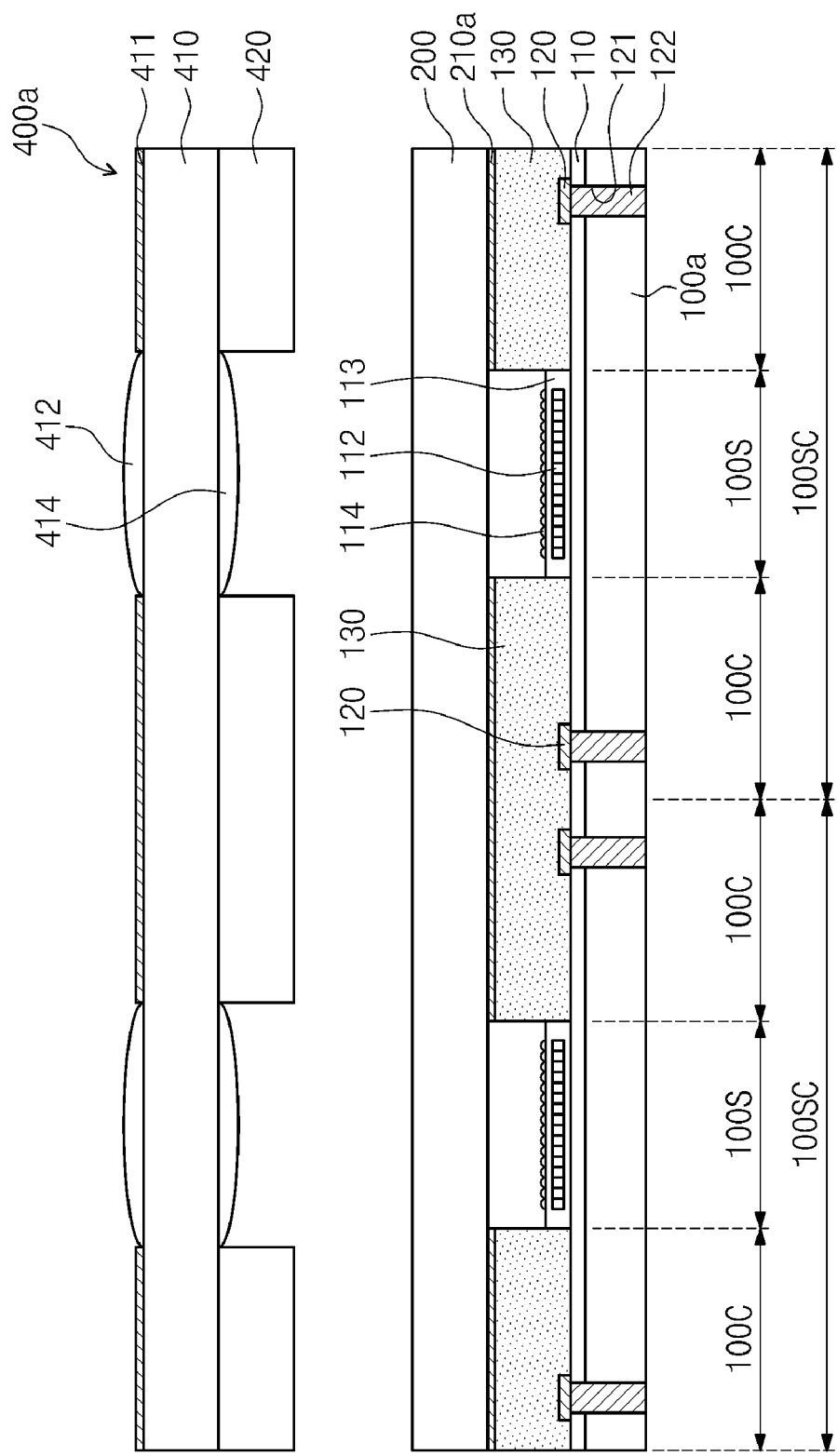

Referring to FIG. 3E, a lens structure substrate 400a is formed on the image sensor chip substrate 100a. The lens structure substrate 400a includes lens substrate 410, support substrate 420, and first and second lenses 412 and 414 on the upper and lower surfaces of the lens substrate 410, respectively. Light blocking layer 411 is formed on the sides of the first lens 412 on the upper surface of the lens substrate 410. The lens substrate 410 may be a glass substrate, for example, of the same kind as that of the transparent substrate 200. The support substrate 420 is formed on the transparent substrate 200 to support the lens substrate 410. The support substrate 420 may also be a glass substrate, for example, of the same kind as that of the transparent substrate 200. The support substrate 420 leaves an opening over the light receiving area 100S.

The first and second lenses 412 and 414 are substantially aligned with and positioned over the light receiving area 100S. The first and second lenses 412 and 414 may be formed of a glass or polymer layer, for example. The light blocking layer 411 blocks entrance of light to areas other than the light receiving area 100S. The lens structure substrate 400a may be formed in a multi-layered structure including multiple lens substrates 410 and multiple first and second lenses 412 and 414. The lens structure substrate 400a is aligned on the image sensor chip substrate 100a such that the first and second lenses 412 and 414 are over the light receiving areas 100S.

Referring to FIG. 3F, the image sensor chip substrate 100a and the lens structure substrate 400a are attached to each other. More particularly, the support substrate 420 is attached to the transparent substrate 200 to fix the lens structure substrate 400a. Individual camera modules are obtained by performing a dicing or separating process, cutting the attached lens structure substrate 400a (lens structure 400b) and image sensor chip substrate 100a (image sensor chip 100b) along line B-B', corresponding to chip areas 100SC.

Figure 3G:
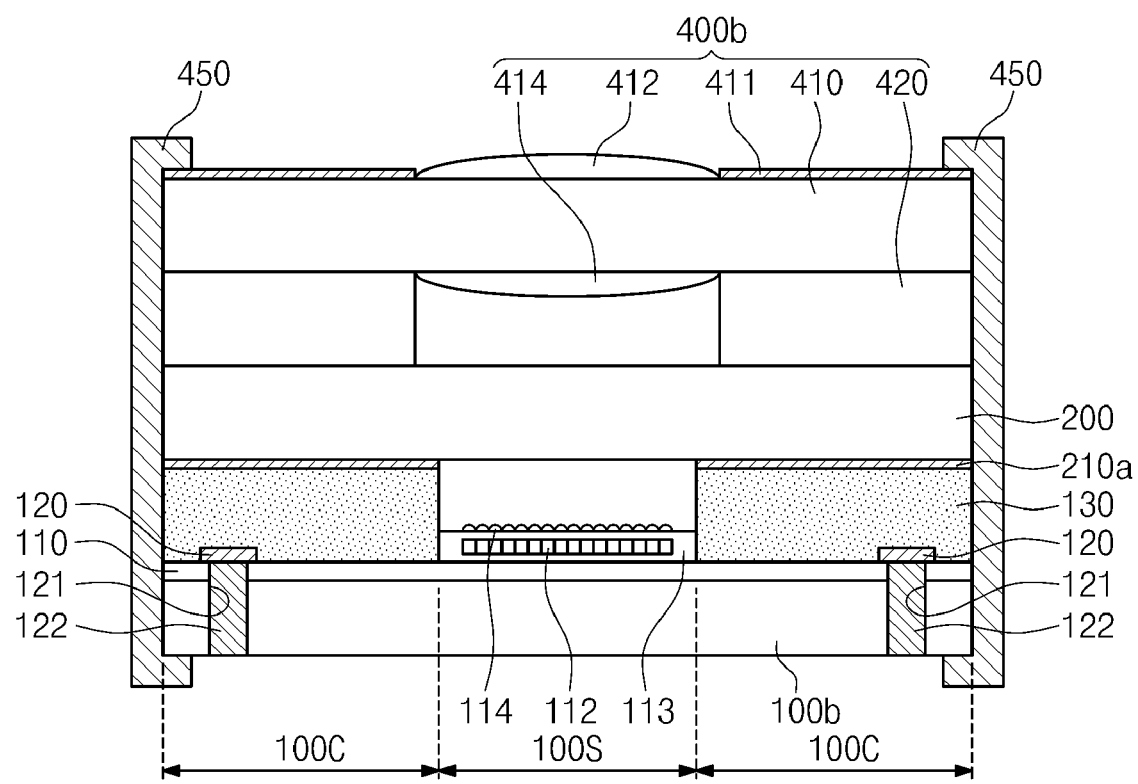

Referring to FIG. 3G, the housing 450 is formed to cover the lateral sides of the lens structure 400b, the transparent substrate 200, and the adhesive portion 130 of the camera module. The housing 450 may block light passing through and incident to the lateral sides of the housing 450.

Figure 4:
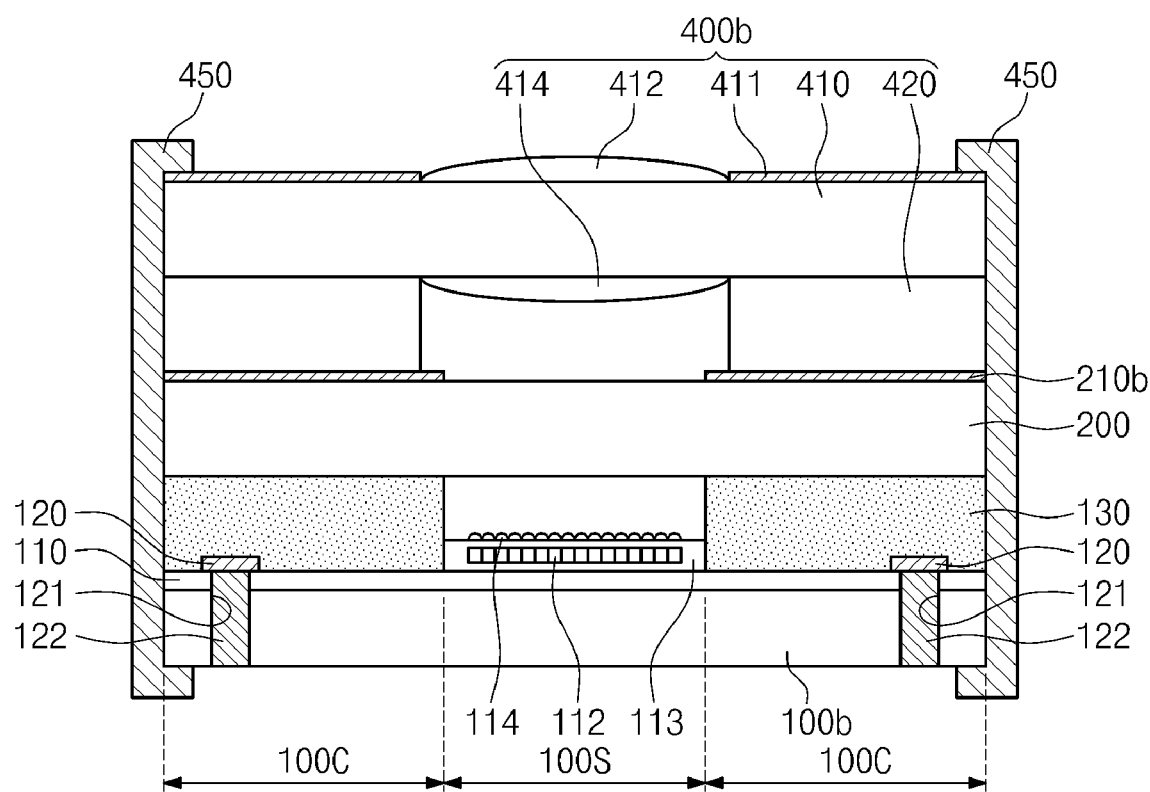
FIG. 4 is a cross-sectional view of a camera module, according to a second embodiment of the present invention.

FIG. 4 is a cross-sectional view of a camera module, according to an illustrative second embodiment of the present invention, which is similar to the first embodiment. Therefore, descriptions of characteristics that are the same as those of the previous embodiment will not be repeated for conciseness.

Referring to FIG. 4, the camera module includes an image sensor chip 100b, a lens structure 400b on the image sensor chip 100b, a transparent substrate 200 between the image sensor chip 100b and the lens structure 400b, and an adhesive portion 130 attaching the image sensor chip 100b to the transparent substrate 200.

Unlike the first embodiment, a light blocking layer 210b is positioned between the transparent substrate 200 and the lens structure 400b, as opposed to between the adhesive portion 130 and the transparent substrate 200. The light blocking layer 210b covers circuit areas 100C to block unnecessary light entering to the circuit areas 100C.

Figure 5:
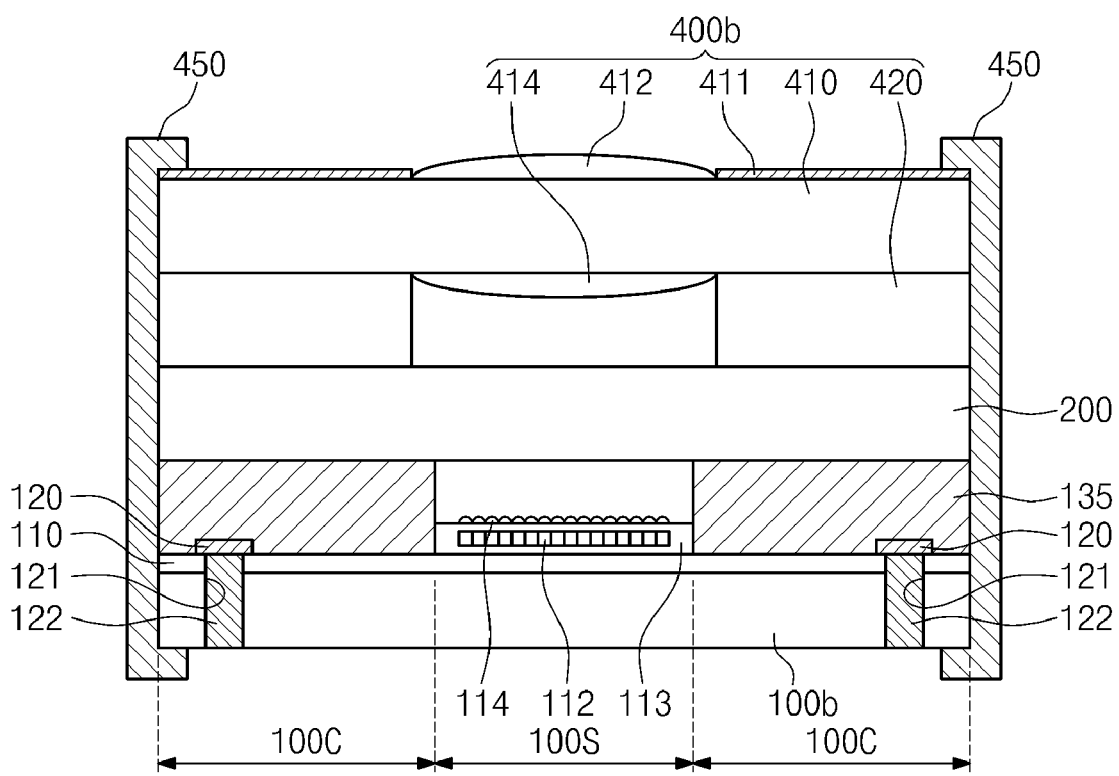
FIG. 5 is a cross-sectional view of a camera module, according to a third embodiment of the present invention.

FIG. 5 is a cross-sectional view of a camera module, according to an illustrative third embodiment of the present invention, which is similar to the first and second embodiments. Therefore, descriptions of characteristics that are the same as those of the previous embodiments will not be repeated for conciseness.

Referring to FIG. 5, the camera module includes an image sensor chip 100b, a lens structure 400b on the image sensor chip 100b, a transparent substrate 200 between the image sensor chip 100b and the lens structure 400b, and an adhesive portion 135 attaching the image sensor chip 100b to the transparent substrate 200. The adhesive portion 135 includes a light blocking agent. For example, the light blocking agent may include metal or a carbon-based organic material, and the light transmittance of the light blocking agent may be 30% or below. Unlike the first and second embodiments, the light blocking agent is added to the adhesive portion 130 instead of a light blocking layer (210a, 210b) to block unnecessary light from entering the circuit areas 100C.

Figure 6:
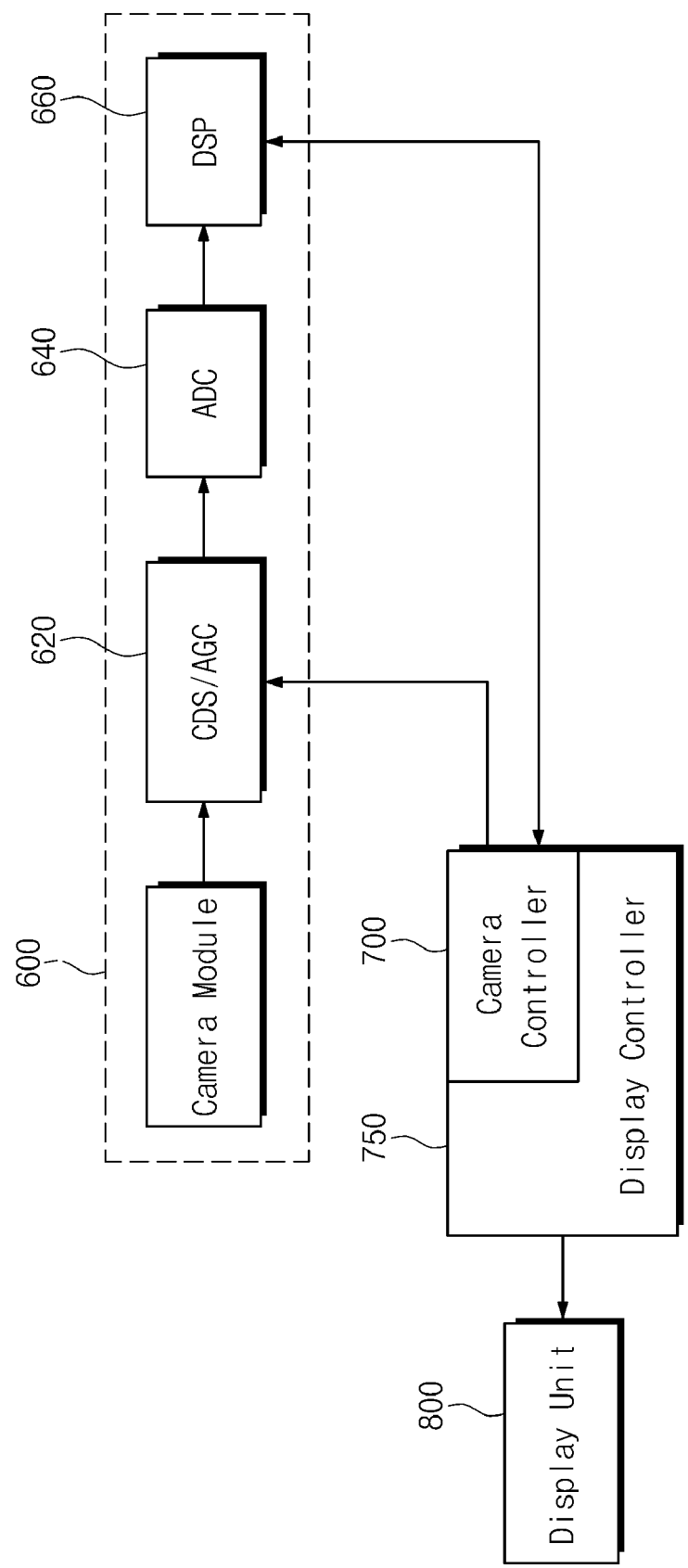
FIG. 6 is a block diagram illustrating an electronic apparatus having a camera module, according to embodiments of the present invention.
Figure 7:
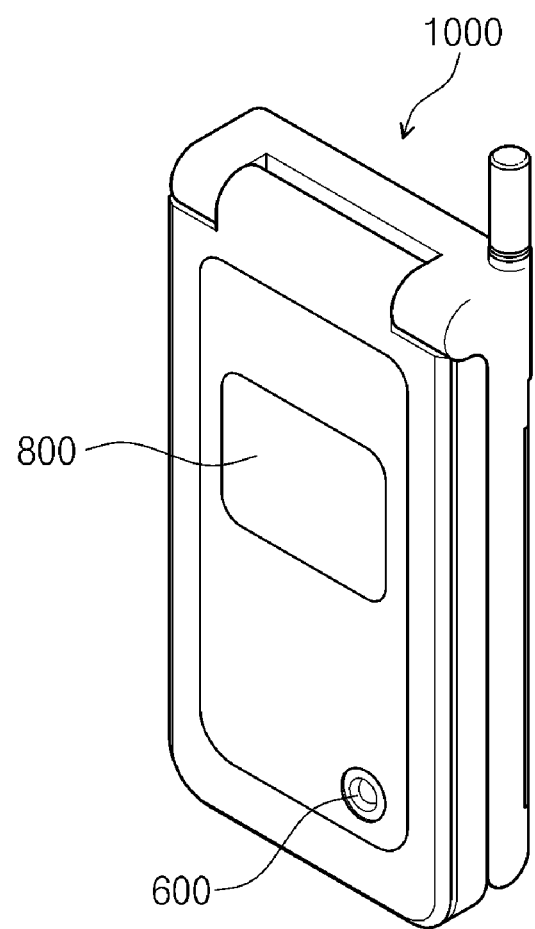
FIG. 7 is a perspective view of an electronic apparatus having a camera module, according to embodiments of the present invention.

FIG. 6 is a block diagram showing an inner structure of an electronic apparatus having a camera module, according to illustrative embodiments of the present invention. FIG. 7 is a perspective view of an electronic apparatus having a camera module, according to illustrative embodiments of the present invention.

Referring to FIGS. 6 and 7, the electronic apparatus may include a camera module unit 600, a camera controller 700, a display controller 750, and a display unit 800. The camera module unit 600 includes a camera module according to the embodiments of the present invention. The camera module converts a light signal into an image-pickup image signal to output the same. The camera module unit 600 may further include a correlated double sampling (CDS)/automatic gain controller (AGC) 620, an analog-to-digital converter (ADC) 640, and a digital signal processor (DSP) 660. The CDS/AGC 620 performs CDS on an image-pickup image signal, and controls gain. The ADC 640 converts the gain-controlled image-pickup image signal into a digital signal, and outputs the same to the DSP 660. The DSP 660 processes the digital image-pickup signal as an image signal.

The camera controller 700 may be implemented in a central processing unit (CPU), for example, and controls operations of the camera module unit 600 on the whole. The display unit 800 outputs an image shot by a camera on a screen, for example. The display controller 750 controls the display unit 800 to output the image.

The electronic apparatus may be a cellular phone 1000, a camera phone, a digital camera or personal portable information terminal, such as a personal digital assistant (PDA), and a smart display, including the camera module unit 600, for example. According to the various embodiments, an electronic apparatus is provided that blocks unnecessary light from entering light receiving areas of an image sensor to obtain a high quality image.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A camera module comprising:
an image sensor chip comprising a light receiving area and a circuit area;
a lens structure on the image sensor chip configured to allow light to enter the image sensor chip;
a transparent substrate between the image sensor chip and the lens structure, the transparent substrate allowing the light from the lens structure to enter the light receiving area;
an adhesive portion for attaching the image sensor chip and the transparent substrate, and covering the circuit area;
a light blocking layer attached to the transparent substrate to block light from entering the circuit area; and
a color filter layer located within the light receiving area, and surrounded by a polymer layer that does not extend between the adhesive portion and a portion of the image sensor chip corresponding to the circuit area.

2. The camera module of claim 1, wherein the light blocking layer is between the transparent substrate and the adhesive portion.

3. The camera module of claim 1, wherein the light blocking layer is between the transparent substrate and the lens structure.

4. The camera module of claim 1, wherein the light blocking layer comprises one of metal and a carbon-based organic material.

5. The camera module of claim 1, wherein the image sensor chip further comprises a dielectric positioned below the adhesive portion and covering the light receiving area and the circuit area of the image sensor chip.

6. The camera module of claim 5, wherein the dielectric comprises one of a silicon oxide layer and a silicon nitride layer.

7. The camera module of claim 6, wherein the adhesive portion comprises one of a polyimide-based adhesive and an epoxy-based adhesive.

8. The camera module of claim 7, wherein the adhesive portion defines a cavity, extending between the image sensor chip and the transparent substrate and exposing the light receiving area.

9. The camera module of claim 8, wherein the color filter layer is located in the cavity.

10. The camera module of claim 9, wherein the image sensor chip further comprises an electrode located in the circuit area and providing an outside electrical connection.

11. The camera module of claim 9, wherein the lens structure comprises:
a lens substrate;
a support substrate on the transparent substrate for supporting the lens substrate, the support substrate defining a opening corresponding to the light receiving area;
a first lens on an upper surface of the lens substrate and a second lens on a lower surface of the lens substrate, the lower surface being opposite to the upper surface; and
a light blocking layer adjacent to the first lens on the upper surface of the lens substrate to block entrance of light to areas other than the light receiving area.

12. The camera module of claim 11, further comprising a housing covering sides of the lens structure, the transparent substrate, and the image sensor chip.

13. An electronic apparatus comprising the camera module of claim 1.

14. A camera module comprising:
- an image sensor chip comprising a light receiving area and a circuit area;
- a lens structure on the image sensor chip configured to enable light to enter the image sensor chip;
- a transparent substrate between the image sensor chip and the lens structure, the transparent substrate enabling the light from the lens structure to enter the light receiving area;
- an adhesive portion for attaching the image sensor chip and the transparent substrate, and covering the circuit area, the adhesive portion comprising a light blocking agent for blocking unnecessary light from entering at least the circuit area; and
- a color filter layer located within the light receiving area, and surrounded by a polymer layer that does not extend between the adhesive portion and a portion of the image sensor chip corresponding to the circuit area.

15. The camera module of claim 14, wherein the adhesive portion comprises one of a polyimide-based adhesive and an epoxy-based adhesive.

16. The camera module of claim 15, wherein the light blocking agent comprises one of metal and a carbon-based organic material.

17. An electronic apparatus comprising the camera module of claim 14.

* * * * *